[12] United States Patent
Richaud et al.

(10) Patent No.: US 8,470,089 B2
(45) Date of Patent: Jun. 25, 2013

(54) ANNEALING OF SINGLE CRYSTALS

(75) Inventors: Dominique Richaud, Fontainebleau (FR); Alain Iltis, Montigny sur Loing (FR); Vladimir Ouspenski, Saint-Pierre les Nemours (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 1383 days.

(21) Appl. No.: 12/121,459

(22) Filed: May 15, 2008

(65) Prior Publication Data
US 2009/0246495 A1 Oct. 1, 2009

(30) Foreign Application Priority Data
Mar. 31, 2008 (FR) .................................... 08 52072

(51) Int. Cl.
C30B 1/02 (2006.01)
(52) U.S. Cl.
USPC ........................................ 117/4; 117/8; 117/9
(58) Field of Classification Search
None
See application file for complete search history.

(56) References Cited

U.S. PATENT DOCUMENTS

| | | | |
|---|---|---|---|
| 4,535,243 A | 8/1985 | Peschmann | |
| 4,958,080 A | 9/1990 | Melcher et al. | |
| 6,021,341 A | 2/2000 | Scibilia et al. | |
| 7,067,815 B2 | 6/2006 | Dorenbos et al. | |
| 7,067,816 B2 | 6/2006 | Dorenbos et al. | |
| 7,081,626 B2 | 7/2006 | Ianakiev et al. | |
| 7,084,403 B2 | 8/2006 | Srivastava et al. | |
| 7,151,261 B2 | 12/2006 | Chai | |
| 7,202,477 B2 | 4/2007 | Srivastava et al. | |
| 7,233,006 B2 | 6/2007 | Dorenbos et al. | |
| 7,250,609 B2 | 7/2007 | Dorenbos et al. | |
| 7,332,028 B2 | 2/2008 | Iltis et al. | |
| 7,767,975 B2 | 8/2010 | Flamanc et al. | |
| 2005/0006589 A1 | 1/2005 | Joung et al. | |
| 2005/0067579 A1 | 3/2005 | Tsuchiya et al. | |
| 2005/0082484 A1 | 4/2005 | Srivastava et al. | |
| 2005/0104001 A1 | 5/2005 | Shah | |
| 2005/0127300 A1 | 6/2005 | Bordynuik | |
| 2005/0269513 A1 | 12/2005 | Ianakiev et al. | |
| 2006/0065848 A1 | 3/2006 | Ueno et al. | |
| 2006/0104880 A1 | 5/2006 | Iltis | |
| 2006/0131503 A1 | 6/2006 | Freund et al. | |
| 2006/0226368 A1 | 10/2006 | Srivastava et al. | |
| 2006/0237654 A1 | 10/2006 | Srivastava et al. | |
| 2007/0090328 A1 | 4/2007 | Dorenbos et al. | |
| 2007/0131866 A1 | 6/2007 | Srivastava et al. | |
| 2007/0205372 A1 | 9/2007 | Pauly et al. | |
| 2007/0241284 A1 | 10/2007 | Iltis et al. | |
| 2007/0290136 A1 | 12/2007 | Ivan | |
| 2007/0295915 A1 | 12/2007 | Kraemer et al. | |
| 2008/0047482 A1* | 2/2008 | Venkataramani ................. 117/7 |
| 2008/0103391 A1 | 5/2008 | Dos Santos Varela | |
| 2008/0173819 A1 | 7/2008 | Grazioso et al. | |
| 2008/0296503 A1 | 12/2008 | Srivastava et al. | |
| 2009/0008561 A1 | 1/2009 | Nagarkar et al. | |
| 2009/0140150 A1 | 6/2009 | Ivan et al. | |
| 2009/0140153 A1 | 6/2009 | Flamanc et al. | |
| 2010/0224798 A1 | 9/2010 | Dorenbos et al. | |
| 2011/0017914 A1 | 1/2011 | Flamanc et al. | |

FOREIGN PATENT DOCUMENTS

| | | |
|---|---|---|
| WO | 99/61880 A | 12/1999 |
| WO | 01/60944 A2 | 8/2001 |
| WO | 01/60945 A2 | 8/2001 |
| WO | 03-106741 | 12/2003 |
| WO | 2004044613 A2 | 5/2004 |
| WO | 2007/031583 | 3/2007 |

OTHER PUBLICATIONS

FR Search Report, 2 pgs.
Allier, C.P., et al., "Readout of a LaCl3 (Ce3+) Scintillation Crystal with a Large Area Avalanche Photodiode," Nuclear Science Symposium Conference Record, Oct. 15, 2000 IEEE Lyon, FR, vol. 1, pp. 6/182-6/184, 2000, XP010556545.
Grazioso, R., et al., "APD Performance in Light Sharing PET Applications," IEEE Transactions on Nuclear Science IEEE, USA, Vol. 52, No. 5, Oct. 2005, pp. 1413-1416, 2005, XP002503510.
Okamura, S. et al., "Readout of scintillating fibers by avalanche photodiodes operated in the normal avalanche mode," Nuclear Instruments and Methods in Physics Research A, vol. 388, pp. 234-240, 1997.
M. D. Birowosuto, "Ce3+ activated LaBr3—xlx: High-light-yield and fast-response mixed halide scintillators," Journal of Applied Physics, vol. 103, pp. 103517-1 to 103517-6, 2008.
A. Bessiere et al., "Luminescence and scintillation properties of the small bandgap compound Lal3:Ce3+", Nuclear Instruments and Methods in Physics Research, Section A 537, 2005, pp. 22-26.
J. Glodo et al., "Scintillation properties of some Ce-doped mixed lanthanum halides", Proceedings of the 8th International Conference on Inorganic Scintillators and their Use in Scientific and Industrial Applications (SCINT 2005), Alushta (Crimea, Ukraine), ISBN 9666 02 3884 3, pp. 118-120.
W.M. Higgins et al.; "New Scintillator Compositions"; Proceedings of SPIE—The International Society for Optical Engineering—Penetrating Radiation Systems and Applications VIII 2007 SPIE US, vol. 6707, 2007, XP002508317, pp. 670704-1, ligne 26—pp. 670704-2, ligne 27; figure 1-4.

(Continued)

Primary Examiner — Bob M Kunemund
(74) Attorney, Agent, or Firm — Abel Law Group, LLP

(57) ABSTRACT

The invention relates to a process for manufacturing a single crystal comprising a rare-earth halide, having improved machining or cleavage behavior, comprising heat treatment in a furnace, the atmosphere of which is brought, for at least 1 hour, to between 0.70 times $T_m$ and 0.995 times $T_m$ of a single crystal comprising a rare-earth halide, $T_m$ representing the melting point of said single crystal, the temperature gradient at any point in the atmosphere of the furnace being less than 15 K/cm for said heat treatment. After carrying out the treatment according to the invention, the single crystals may be machined or cleaved without uncontrolled fracture. The single crystals may be used in a medical imaging device, especially a positron emission tomography system or a gamma camera or a CT scanner, for crude oil exploration, for detection and identification of fissile or radioactive materials, for nuclear and high-energy physics, for astrophysics or for industrial control.

12 Claims, No Drawings

OTHER PUBLICATIONS

W.M. Higgins et al.; "Crystal Growth of Large Diameter LaBr3:Ce and CeBr3"; Journal of Crystal Growth, Elsevier, Amsterdam, NL, vol. 310, No. 7-9, Apr. 1, 2008, pp. 2085-2089, XP022697586, ISSN: 0022-0248 [extrait le Dec. 23, 2007] pp. 2085, colonne 2, ligne 19—p. 2087, colonne 1, ligne 10; figures 1-3; tableau 1.

G.F Knoll, "Radiation Detection and Measurement", John Wiley and Sons, Inc., 2nd edition, p. 114.

R. Scafé et al., Nuclear Instruments and Methods in Physics Research A 571 (2007) 355-357.

K. S. Shah et al., IEEE Transactions on Nuclear Science, vol. 51, No. 5, Oct. 2004.

C. P. Allier et al., Nuclear Instruments and Methods in Physics Research A 485 (2002) 547-550.

K. Krämer et al. Development and characterization of highly efficient new cerium doped rare earth halide scintillator materials, J. Mater. Chem., 2006, 16, pp. 2773-2780.

C. van Eijk et al. Development of elpasolite and monoclinic thermal neutron scintillators, 2005 IEEE Nucl. Sci. Symp. Conf. Record, 1, pp. 239-243.

J. Glodo et al., IEEE Nucl. Sci. Symp. Conf. Record, 2005, pp. 98-101.

E.V.D. van Loef et al., Optics Communications, 189, 2001, pp. 297-304.

O. Guillot-Noël et al., J. Luminescence, 85, 1999, pp. 21-35.

W. Moses et al., Nucl. Instruments and Methods in Physics Research, A, 537, 2005, pp. 317-320.

E.V.D. van Loef et al., IEEE Trans. Nucl. Sci., 52, 5, 2005, pp. 1819-1822.

U.N. Roy et al., "Hard X-Ray and Gamma-Ray Detector Physics VII", Proceedings of the SPIE, 5922, 2005, pp. 30-34.

J. Völkl, "Stress in cooling crystal" in Handbook of Crystal Growth, Ed. North Holland, Edited by D. T. J. Hurle, 1994, ISBN 0-444-81554-6, pp. 821-874.

K. Findley et al. ("Fracture and deformation behaviour of common and novel scintillating single crystals", Proceedings of SPIE, The International Society for Optical Engineering, 2007, vol. 6707, pp. 6707 06.

French Search Report from Application No. 0759555 dated Nov. 14, 2008 (2pgs).

U.S. Appl. No. 12/037,695, filed Feb. 26, 2008, Inventors: Jeremy Flamanc et al.

U.S. Appl. No. 12/439,117, filed Feb. 26, 2009, Inventors: Jeremy Flamanc et al.

U.S. Appl. No. 12/558,373, filed Sep. 11, 2009, Inventors: Pieter Dorenbos et al.

St. Gobain Detectors. "Detector Assembly Materials". Copyright 2005. Accessed Aug. 17, 2012. <http://www.detectors.saint-gobain.com/uploadedFiles/SGdetectors/Documents/Product_Data_Sheets/SGC_Detector_Assembly_Materials_Data_Sheet.pdf>.

St. Gobain Detectors. "Scintillation Detectors with Demountable PMT". Copyright 2002. Accessed Aug. 17, 2012. <http://www.detectors.saint-gobain.com/uploadedFiles/SGdetectors/Documents/Product-Configurations/Demountable-Detectors.pdf>.

St. Gobain Detectors. "Scintillation Products". Copyright 2006. Accessed Aug. 21, 2012. <http://www.detectors.saint-gobain.com/uploadedFiles/SGdetectors/Documents/Brochures/Security-Products_brochures.pdf>.

\* cited by examiner

ANNEALING OF SINGLE CRYSTALS

The present application claims priority from French Application No. 0852072, filed Mar. 31, 2008, which application is incorporated by reference herein in its entirety.

The invention relates to a heat treatment applied to single crystals of rare-earth halides to improve their mechanical properties, and also to the use of these single crystals treated by the process to produce large-size parts for manufacturing detectors of ionizing radiation and large cleaved parts. The compositions of the single crystals in question in the invention are scintillator materials based on rare-earth halides.

The single crystals in question in the present invention are those directly obtained by crystal growth or those obtained by fracture, generally uncontrolled, of larger single crystals, for example obtained by crystal growth. Scintillator detectors are widely used for detecting gamma rays, X-rays, high-energy cosmic rays, charged particles having an energy between 1 keV and 10 MeV, between 1 keV and 1 Gev, between 1 keV and 10 GeV, thermal neutrons (the energy of which is typically less than 0.1 eV).

Scintillator detectors are used in numerous applications. Mention may be made, as non-exhaustive examples, of medical imaging (especially positron emission tomography systems, gamma cameras, CT scanners), crude oil exploration (well-logging), equipment for detecting and identifying fissile or radioactive materials, experiments in nuclear and high-energy physics, detectors for astrophysics or else industrial control.

A scintillator detector is composed of a scintillator material which converts the energy of the particles or radiation absorbed to ultraviolet or visible or infrared light and a photon collector which captures the light emitted and converts it to an electrical signal. The scintillator materials are in the form of a powder, of single crystals, of transparent polycrystalline ceramics, of glasses, of plastics and of liquids. The single-crystal materials, that is to say parts which, on the scale of use, are composed of a single crystal (at most a few crystals), are particularly suitable for producing scintillators. The use of single crystals has several advantages. Compared to polycrystalline materials, for parts of large thickness, the single crystals offer a better transparency and therefore a better extraction of the light due to the absence of grain boundaries and defects responsible for the dissipation of light in the solid. In the applications, when it is possible, the single crystals are preferred materials for scintillation. The photon collectors may be photomultiplier tubes or any light converter compatible with the emission wavelength of the material (example: photodiodes, avalanche photodiodes, etc.).

Rare-earth halides are materials known in the field of scintillator materials. The article by K. Krämer et al. (Development and characterization of highly efficient new cerium doped rare earth halide scintillator materials, J. Mater. Chem., 2006, 16, pp. 2773-2780), gives several examples of these scintillator crystals doped with cerium and which are characterized by a combination of good scintillation properties such as good energy resolution, a high light yield and a rapid response. For example, in this publication, $LaBr_3$ doped with 5 mol % of cerium has an energy resolution of 2.6% under excitation at 662 keV (main gamma emission of $^{137}Cs$), a light yield of 70 000 photons per MeV and a scintillation decay time of 16 ns. Another example cited is cerium-doped $LuI_3$ which has an energy resolution of 3.3% at 662 keV, a light yield of 95 000 photons per MeV and a scintillation decay time of 24 ns for the main light component. Also, the publication by C. van Eijk et al. (Development of elpasolite and monoclinic thermal neutron scintillators, 2005 IEEE Nucl. Sci. Symp. Conf. Record, 1, pp. 239-243) has the properties of compounds based on rare-earth halides for the simultaneous detection of neutrons and gamma rays. For example, $Rb_2LiYBr_6$ doped with 0.5 mol % of Ce has a light yield of 18 000 photons per MeV at 662 keV and a light yield of 65 000 photons per neutron (thermal neutrons). Other examples taken from the same article are $Cs_2LiYCl_6$ doped with 0.1 mol % of cerium, $Cs_2LiLaCl_6$ doped with 1 mol % of cerium, $Rb_2LiYI_6$ doped with 0.5 mol % of cerium, and $Li_3YBr_6$ doped with 0.5 mol % of cerium which respectively have light yields at 662 keV of 18 000 photons per MeV, 28 000 photons per MeV, 7000 photons per MeV and 6000 photons per MeV. Other non-exhaustive examples of compounds based on rare-earth halides for scintillation cited in the literature are: $LaBr_3$ doped with praseodymium (J. Glodo et al., IEEE Nucl. Sci. Symp. Conf. Record, 2005, pp. 98-101), $GdBr_3$ doped with cerium (E. V. D. van Loef et al., Optics Communications, 189, 2001, pp. 297-304), $LuCl_3$ and $LuBr_3$ doped with cerium (O. Guillot-Noël et al., J. Luminescence, 85, 1999, pp. 21-35), $RbGd_2Br_7$ doped with cerium (W. Moses et al., Nucl. Instruments and Methods in Physics Research, A, 537, 2005, pp. 317-320), $Cs_2LiYCl_6$ doped with praseodymium (E. V. D. van Loef et al., IEEE Trans. Nucl. Sci., 52, 5, 2005, pp. 1819-1822), $K_2LaBr_5$ doped with cerium (U. N. Roy et al., "Hard X-Ray and Gamma-Ray Detector Physics VII", Proceedings of the SPIE, 5922, 2005, pp. 30-34).

Rare-earth halides are difficult to produce in the form of single crystals. This is because these compounds are very reactive with oxygen and water vapour. The chemical reaction at high temperature with oxygen and water vapour is irreversible and the crystals must therefore be crystallized in such a way that any reaction with these elements is impossible. The solution is to carry out the crystal growth in a device that is airtight, under vacuum or under an atmosphere that is not reactive with respect to the crystal. Another aspect is the crystal growth, without fracturing and without residual mechanical stresses, of single crystals that are sufficiently large to produce large-size detectors. This is because mechanical stresses of thermal origin are created within the crystals during growth and during cooling in the growth furnace (J. Völkl, "Stress in cooling crystal" in Handbook of Crystal Growth, Ed. North Holland, Edited by D. T. J. Hurle, 1994, ISBN 0-444-81554-6, pp. 821-874).

The mechanical stresses may be very high and may even exceed the strength of the materials and cause fracturing of the single crystals into several pieces. Even when the process is optimized to avoid fracturing during crystal growth and cooling, a large portion of residual stresses remain in the single crystals. In the best of cases, these residual stresses are not sufficient to cause fracturing of the crystals but, during the machining steps (for example cutting, milling, turning, polishing, etc.) microcracks develop in the materials and propagate under the effect of the residual stresses, which finally causes fracturing of the single crystals. This problem makes it very difficult to produce single-crystal parts for the production of detectors, especially to produce large-size single-crystal parts. The effect of the residual stresses in also important in the case of producing parts by the cleavage method. Cleavage is a distinctive feature that certain single crystals have of fracturing along certain precise crystalline planes when they are subjected to an impact or to a mechanical stress. The cleaved surfaces are extremely flat, even and have no roughness and they may be used for producing very high quality surfaces. In the single crystals that contain residual stresses, the cleavage process is normally disrupted by the formation of numerous macroscopic steps and/or parasitic breaks that do not follow the crystalline cleavage plane. The cleaved surface will then be highly irregular. A good cleaved surface has few or no macroscopic steps and the heights of the steps remain low. A person skilled in the art easily distinguishes a cleaved surface from a surface obtained by crystal growth or by mechanical cutting.

In the case of single crystals based on rare-earth halides, the question of fracturing is extremely important as these materials have the characteristic of being very brittle. An illustration of the brittleness of these compounds is given in the article by K. Findley et al. ("Fracture and deformation behaviour of common and novel scintillating single crystals", Proceedings of SPIE, The International Society for Optical Engineering, 2007, vol 6707, pp. 6707 06) which shows that the cerium-doped $LaBr_3$ crystals have a very low fracture toughness. Obtaining large-size parts and parts with large cleaved surfaces is therefore a problem that is particularly difficult to solve for this type of single crystals.

The invention described here is a heat treatment which enables the elimination or the reduction of the residual stresses in single crystals after the crystal growth process has been carried out. The heat treatment of the invention is carried out by heating up to the treatment temperature, by maintaining this treatment temperature, then by cooling to ambient temperature. The treatment temperature is slightly below the melting point of the material treated. The gaseous atmosphere during the treatment is protective and makes it possible to prevent the reaction of the treated crystals with oxygen or water vapour.

The process according to the invention does not modify the scintillation performance of the annealed single crystals as can be the case in certain processes which are especially applied to the crystals of oxides. For example, as is described in U.S. Pat. No. 7,151,261, the temperature treatment of single crystals of lutetium orthosilicates under reactive atmospheres containing oxygen makes it possible to substantially improve the performances of the materials treated. The treatment is, in this case, carried out at temperatures much lower than the melting point of the treated crystals and the oxygen contained in the treatment atmosphere reacts with the treated materials.

The invention described here firstly relates to a process for manufacturing a single crystal comprising a rare-earth halide, having improved machining or cleavage behaviour, said process comprising heat treatment in a furnace, the atmosphere of which is brought, for at least 1 hour, to between 0.70 times $T_m$ and 0.995 times $T_m$ of a single crystal comprising a rare-earth halide, $T_m$ representing the melting point of said single crystal, the temperature gradient at any point in the atmosphere of the furnace being less than 15 K/cm and preferably less than 5 K/cm and more preferably less than 0.5 K/cm during said heat treatment.

It appears that this treatment enables the relaxation of the residual stresses via plastic rearrangements. After this step, well-controlled cooling makes it possible to avoid formation of new residual stresses in the single crystals.

The invention can be applied to large-size single crystals, especially having a volume greater than 50 $cm^3$, and even greater than 100 $cm^3$, and even greater than 300 $cm^3$, and even greater than 1850 $cm^3$. After carrying out the treatment according to the invention, these single crystals may be machined or cleaved without uncontrolled fracture.

The treatment according to the invention makes it possible, via machining or via the cleavage method, to produce large machined or cleaved surfaces with, for example, machined or cleaved surfaces greater than or equal to 5 $cm^2$, or even greater than or equal to 9 $cm^2$, or even greater than 12 $cm^2$, and also, via other methods, to manufacture very large parts with, for example, volumes greater than or equal to 50 $cm^3$ or even greater than or equal to 1850 $cm^3$, on condition that the initial volumes and the initial sizes of the single crystals allow it.

The invention relates to a method of heat treatment for eliminating or reducing the residual stresses in single crystals comprising a rare-earth halide. In particular, the composition of the single crystal may correspond to the formula $A_n Ln_p X_{(3p+n)}$ in which Ln represents one or more rare-earth elements, that is to say an element chosen from Y, Sc and the lanthanide series from La to Lu, X represents one or more halogen atoms chosen from Cl, Br and I, and A represents one or more alkali metals such as Li, Na, K, Rb or Cs, n and p are numbers such that n is greater than or equal to zero and less than or equal to 3 and p is greater than or equal to 1.

In particular, the composition may have the formula $A_n Ln_{(p-x)} Ln'_x X_{(3p+n)}$ in which Ln represents one or more rare-earth elements, that is to say an element taken from Y, Sc and the lanthanide series from La to Lu and more particularly from Y, La, Gd, Lu or a mixture of these elements, Ln' is a doping element, that is to say a rare-earth element and more particularly an element chosen from Ce, Pr and Eu, x is a number greater than or equal to 0.0005 and less than p.

Examples of such crystals are:

$LaCl_3$, which may especially be doped with 0.1 to 50 mol % of Ce (i.e. p=1 and x=0.001 to 0.5 in the formula);

$LnBr_3$, which may especially be doped with 0.1 to 50 mol % of Ce (i.e. p=1 and x=0.001 to 0.5 in the formula);

$LaBr_3$, which may especially be doped with 0.1 to 50 mol % of Ce (i.e. p=1 and x=0.001 to 0.5 in the formula);

$GdBr_3$, which may especially be doped with 0.1 to 50 mol % of Ce (i.e. p=1 and x=0.001 to 0.5 in the formula);

$La_z Ln_{(1-z)} X_3$, which may especially be doped with 0.1 to 50 mol % of Ce (i.e. p=1 and x=0.001 to 0.5 in the formula), z possibly varying from 0 to 1, Ln being a rare earth other than La, X being a halogen such as mentioned previously;

$La_z Gd_{(1-z)} Br_3$, which may especially be doped with 0.1 to 50 mol % of Ce (i.e. p=1 and x=0.001 to 0.5 in the formula), z possibly varying from 0 to 1;

$La_z Ln_{(1-z)} Br_3$, which may especially be doped with 0.1 to 50 mol % of Ce (i.e. p=1 and x=0.001 to 0.5 in the formula), z possibly varying from 0 to 1;

$Ln_z Ln''_{(1-z)} X_{3(1-y)} X'_{3y}$, in which Ln and Ln'' are two different rare earths, X and X' being two different halogens, in particular Cl, Br or I, z possibly varying from 0 to 1, and y possibly varying from 0 to 1;

$RbGd_2Br_7$, which may especially be doped with 0.1 to 50 mol % of Ce (i.e. n=1, p=2 and x=0.002 to 1 in the formula);

$RbLn_2Cl_7$, which may especially be doped with 0.1 to 50 mol % of Ce (i.e. n=1, p=2 and x=0.002 to 1 in the formula);

$RbLn_2Br_7$, which may especially be doped with 0.1 to 50 mol % of Ce (i.e. n=1, p=2 and x=0.002 to 1 in the formula);

$CsLn_2Cl_7$, which may especially be doped with 0.1 to 50 mol % of Ce (i.e. n=1, p=2 and x=0.002 to 1 in the formula);

$CsLn_2Br_7$, which may especially be doped with 0.1 to 50 mol % of Ce (i.e. n=1, p=2 and x=0.002 to 1 in the formula);

$K_2LaCl_5$, which may especially be doped with 0.1 to 50 mol % of Ce (i.e. n=2, p=1 and x=0.001 to 0.5 in the formula);

$K_2LaI_5$, which may especially be doped with 0.1 to 50 mol % of Ce (i.e. n=2, p=1 and x=0.001 to 0.5 in the formula) and $Cs_{(2-z)}Rb_zLiLnX_6$, where X is either Cl or Br or I, Ln is Y or Gd or Lu or Sc or La, where z is greater than or equal to 0 and less than or equal to 2. Crystals which may be doped with different molar percentages of Ce (i.e. n=3, p=1 and $0.0005 \leq x < 1$ in the formula).

The use of the treatment process according to the invention makes it possible to prevent fracturing of large brittle single crystals during all the steps in the production line. This treatment also facilitates the production of parts via the cleavage method.

As is presented in WO 3106741, it is preferable to use graphite crucibles for handling rare-earth halides. For the heat treatment according to the invention, the single crystals are placed in high-purity graphite crucibles closed by high-purity graphite lids.

The heat treatment according to the invention is carried out in a furnace which has a high thermal homogeneity, so as to effectively reduce the stresses in the single crystals. This is because the presence of high thermal gradients in the furnace during the treatment would lead to the formation of new stresses which could cause fracturing of the crystal. In the furnace, the local temperature gradient is, at any point, less than 15 K/cm, preferably less than 5 K/cm and more preferably less than 0.5 K/cm. This homogeneity in the furnace atmosphere around the part to be treated has the objective of a high temperature homogeneity of the part itself. The part treated is therefore also homogeneous during the period it is held at temperature.

It is recalled that in the crystal growth processes for single crystals based on a rare-earth halide, the environment of the crystal has high temperature gradients, well above 15 K/cm.

The heat treatment according to the invention is carried out in an airtight furnace. The compounds based on rare-earth halides are very reactive at high temperature with oxygen and water vapour and the heat treatment must be carried out under a controlled atmosphere. The atmosphere may be dynamic (continuous pumping under vacuum or gas purging throughout all the steps of the heat treatment) or else static (filling the furnace with gas or putting it under a vacuum at the start of the heat treatment). The atmosphere for the treatment is vacuum or inert gases (with a low residual content of oxygen and of water vapour) such as, for example, nitrogen ($N_2$), helium (He), argon (Ar), or halogen gases such as, for example, chlorine ($Cl_2$), bromine ($Br_2$), iodine ($I_2$), hydrogen chloride (HCl), hydrogen bromide (HBr), hydrogen iodide (HI); hydrogen ($H_2$); or any mixture of these gases. Nitrogen and argon atmospheres are particularly suitable as these gases can be handled easily.

At temperatures close to the melting point of the material, the residual elastic stresses may be relaxed via plastic rearrangements. The heat treatment temperature is chosen as a function of the melting point (denoted $T_m$) of the material treated and is expressed in kelvin ($T_m$ [K]=273+$T_m$ [° C.]). The pertinent treatment temperatures are between 0.70 times $T_m$ and 0.995 times $T_m$. The temperature range between 0.9 times and 0.995 times $T_m$ is preferred. The duration of the temperature hold must be long enough to allow thermal homogenization within the single crystals and also elimination of the residual stresses by plastic deformation as the accomplishment of the two mechanisms is highly dependent on time (kinetic aspect of the phenomena involved). At the same time, the sizes of the single crystals have a great influence on the treatment time necessary to successfully carry out these two mechanisms: the larger the sizes are, the longer the temperature hold time will be. It is advisable that the treatment temperature be maintained between 1 to 120 hours, depending on the sizes of the single crystals to be treated. Hold times between 15 hours and 24 hours are particularly suitable.

Because the heat transfer coefficients of the materials control the transfer of heat in the single crystals, the heating and cooling rates must be well controlled in order to avoid the formation of temperature gradients (between the edges and the centre) and therefore the formation of mechanical stresses of thermal origin. This aspect is particularly important for the cooling as too rapid a cooling will lead to the formation of new stresses and will destroy the positive effect of the heat treatment. Very slow cooling rates may be used, however the heat treatment duration will then be very long which will considerably increase the cost of the treatment process. The rates are chosen so as to optimize both the efficiency (elimination or reduction of the stresses) and the duration of the annealing cycle. For the heat treatment according to the invention, the heating and cooling rates of the atmosphere in the furnace are chosen between 1 K/h and 30 K/h. Rates between 1 K/h and 10 K/h are particularly suitable. Thus, in the process according to the invention, before the heat treatment of at least one hour, the temperature of the furnace is raised to the temperature of the heat treatment with a rate between 1 K/h and 30 K/h. For the cooling which follows the heat treatment of at least one hour, the temperature decrease rate between the temperature of the heat treatment and 100° C. is between 1 K/h and 30 K/h. The temperature decrease rate between 100° C. and ambient temperature is less critical, but it is nevertheless recommended to continue to cool slowly. Respecting these temperature rises and decreases makes it possible to limit the risks of fracture.

The conditions which have just been given for the heat treatment must be applied simultaneously throughout the whole environment of the part to be treated in order to induce a high temperature homogeneity for the whole of the part to be treated (the whole crystal or one of its blocks obtained by fracturing), and not only over one of its parts.

The invention results in large-size single crystals that are cleaved without unwanted cracking or breaking. In particular, perfect cleavage along the crystallographic planes ($10\bar{1}0$) may be carried out on a single crystal of hexagonal crystal structure having a $P6_3/m$ space group, which includes, in particular, $LaCl_3$, $CeCl_3$, $NdCl_3$, $PrCl_3$, $SmCl_3$, $EuCl_3$, $GdCl_3$, $LaBr_3$, $CeBr_3$, $PrBr_3$, and also the mixtures of at least two of these halides (especially $LaCl_3$ and $LaBr_3$, this mixture possibly being doped by a dopant such as Ce or Pr), these halides possibly being doped by a dopant such as Ce or Pr, and this being for a large single crystal (volume greater than 50 $cm^3$ and even greater than 1850 $cm^3$).

The invention also allows the machining of large single crystals or of blocks of single crystals without unwanted cracking or breaking. The machining operations comprise, for example, cutting, milling, turning and polishing.

The heat treatment according to the invention may advantageously be carried out in the absence of oxygen and water, depending on the degree of sensitivity to oxidation of the crystal, such as, for example, under vacuum, or in an inert atmosphere such as under nitrogen or under argon. In particular, for a given rare earth, the iodide is more sensitive than the bromide which is itself more sensitive than the chloride. The importance of the precautions to be taken from this point of view therefore follow this order.

EXAMPLE 1

Heat Treatment of an LaBr$_3$ Single Crystal Doped with 5 Mol % of Cerium

The melting point of LaBr$_3$ is 788° C. (1061 K). A non-fractured single crystal of LaBr$_3$:Ce was produced and cooled to ambient temperature. The crystal was placed in a high-purity graphite crucible. The crucible was closed by a high-purity graphite lid. The crucible containing the crystal was then introduced into the heat treatment furnace. The furnace was hermetically sealed and an inert atmosphere was set up inside the latter by means of a continuous purge of high-purity nitrogen (flow rate of 20 l/min). The heat treatment consisted of a heating ramp of 10 K/h followed by a temperature hold at 710° C. (983 K) (0.93 times the melting point T$_m$ of LaBr$_3$) for 24 hours, then by a cooling ramp of 10 K/h down to ambient temperature. After the treatment, the single crystal was removed from the crucible and no fracture was visible. The single crystal was then machined to produce a 2"×2" part (cylinder having a diameter of 2" and a height of 2", remember that 1"=2.54 cm) and a 3"×3" part for producing scintillator detectors. During the machining, no cracking was observed: the residual stresses had been removed during the heat treatment.

EXAMPLE 2

Heat Treatment of a Piece Derived from a Fractured Single Crystal of LaBr$_3$ Doped with 5 Mol % of Cerium At the end of the crystal growth process, the single crystal was fractured into several pieces. One of these single-crystal pieces was sufficiently large (volume greater than 50 cm$^3$) to allow the production of large-size detectors. In order to prevent fracturing while machining, the piece was treated by the process according to the invention. The piece was loaded into a high-purity graphite crucible closed by a high-purity graphite lid. The crucible containing the crystal was loaded into a heat treatment furnace. The furnace was hermetically sealed and an inert atmosphere was set up inside the latter by means of a continuous purge of high-purity nitrogen (flow rate of 20 l/min). The heat treatment consisted of a heating ramp of 10 K/h followed by a temperature hold at 710° C. (983 K) (0.93 times the melting point T$_m$ of LaBr$_3$) for 24 hours, then by a cooling ramp of 10 K/h down to ambient temperature. After the treatment, the piece was removed from the crucible and no fracture was visible. The piece was then machined to produce 2"×2" parts (cylinder having a diameter of 2" and a height of 2"). No fracture appeared during the machining operations.

EXAMPLE 3

Heat Treatment of an LaCl$_3$ Single Crystal Doped with 10 Mol % of Cerium

The melting point of LaCl$_3$ is 860° C. (1133 K). A non-fractured single crystal of LaCl$_3$:Ce was produced and cooled to ambient temperature. The crystal was placed in a high-purity graphite crucible closed by a high-purity graphite lid. The crucible containing the crystal was then introduced into the heat treatment furnace. The furnace was hermetically sealed and an inert atmosphere was set up inside the latter by means of a continuous purge of high-purity nitrogen (flow rate of 20 l/min). The heat treatment applied consisted of a heating ramp of 10 K/h followed by a temperature hold at 800° C. (1073 K) (0.95 times the melting point of T$_m$ of LaCl$_3$), for 24 hours, then by a cooling ramp of 10 K/h down to ambient temperature. After the treatment, no fracturing was visible in the single crystal. During the machining no fracture appeared and several 3"×3" parts were obtained (cylinder having a diameter of 3" and a height of 3").

EXAMPLE 4 (COMPARATIVE EXAMPLE)

Machining of a Non-Annealed Crystal of LaBr$_3$ Doped with 5 Mol % of Cerium As in the case of Example 2, a single crystal fractured in several large blocks during the growth was used. Examination of the blocks showed that they could be used for producing parts of large volume. No heat treatment was applied to the blocks before their machining. During the machining operations, the appearance of fractures which propagated in the material was observed. The production of large parts was then impossible.

The invention claimed is:

1. Process for manufacturing a single crystal comprising a rare-earth halide, having improved machining or cleavage behaviour, comprising heat treatment in a furnace, the atmosphere of which is brought, for at least 1 hour, to between 0.70 times T$_m$ and 0.995 times T$_m$ of a single crystal comprising a rare-earth halide, T$_m$ representing the melting point of said single crystal, the temperature gradient at any point in the atmosphere of the furnace being less than 15 K/cm for said heat treatment.

2. Process according to claim 1, wherein the temperature gradient at any point in the atmosphere of the furnace is less than 5 K/cm.

3. Process according to claim 1, wherein the temperature gradient at any point in the atmosphere of the furnace is less than 0.5 K/cm.

4. Process according to claim 1, wherein the heat treatment is carried out between 0.9 times Tm and 0.995 times Tm.

5. Process according to claim 1, wherein before the heat treatment the temperature of the furnace is raised to the temperature of the heat treatment with a rate between 1 K/h and 30 K/h.

6. Process according to claim 1, wherein, after the heat treatment, the temperature of the furnace is reduced to ambient temperature, the temperature decrease rate between the temperature of the heat treatment and 100° C. being between 1 K/h and 30 K/h.

7. Process according to claim 1, wherein the single crystal corresponds to the compounds A$_n$Ln$_p$X$_{(3p+n)}$ where Ln represents one or more elements chosen from Y, Sc and the lanthanide series from La to Lu, X represents one or more halogen atoms chosen from Cl, Br and I, and A represents one or more alkali metals such as Li, Na, K, Rb or Cs, n and p being numbers such that n is greater than or equal to zero and less than or equal to 3 and p is greater than or equal to 1.

8. Process according to claim 1, wherein the single crystal has a volume greater than 50 cm$^3$.

9. Process according to claim 1, wherein the single crystal has a volume greater than 100 cm$^3$.

10. Process according to claim 1, wherein the single crystal has a volume greater than 300 cm$^3$.

11. Process according to claim 1, wherein the single crystal has a volume greater than 1850 cm$^3$.

12. Process for manufacturing a single crystal having improved machining or cleavage behaviour, said single crystal having a volume greater than 100 cm$^3$, said single crystal comprising a rare-earth halide, comprising heat treatment in a furnace, the atmosphere of which is brought, for at least 1 hour, to between 0.9 times $T_m$ and 0.995 times $T_m$, $T_m$ representing the melting point of said single crystal, the temperature gradient at any point in the atmosphere of the furnace being less than 5 K/cm for said heat treatment, before the heat treatment the temperature of the furnace being raised to the temperature of the heat treatment with a rate between 1 K/h and 30 K/h, and after the heat treatment, the temperature of the furnace being reduced to ambient temperature, the temperature decrease rate between the temperature of the heat treatment and 100° C. being between 1 K/h and 30 K/h.

\* \* \* \* \*